United States Patent
Kluge et al.

(10) Patent No.: US 8,193,792 B2
(45) Date of Patent: Jun. 5, 2012

(54) CIRCUIT AND METHOD FOR OPERATING A CIRCUIT

(75) Inventors: Wolfram Kluge, Dresden (DE); Jeannette Zarbock, Dresden (DE); Tilo Ferchland, Dresden (DE)

(73) Assignee: Amtel Corporation, San Jose, CA (US)

( * ) Notice: Subject to any disclaimer, the term of this patent is extended or adjusted under 35 U.S.C. 154(b) by 430 days.

(21) Appl. No.: 12/481,330

(22) Filed: Jun. 9, 2009

(65) Prior Publication Data

US 2009/0302821 A1    Dec. 10, 2009

Related U.S. Application Data

(60) Provisional application No. 61/060,626, filed on Jun. 11, 2008.

(30) Foreign Application Priority Data

Jun. 9, 2008    (DE) .......................... 10 2008 027 392

(51) Int. Cl.
 *G05F 1/44*  (2006.01)
(52) U.S. Cl. ........................................................ 323/282
(58) Field of Classification Search .......... 323/265–268, 323/282–284
See application file for complete search history.

(56) References Cited

U.S. PATENT DOCUMENTS

| | | | |
|---|---|---|---|
| 4,683,382 A | 7/1987 | Sakurai et al. | |
| 6,294,404 B1 | 9/2001 | Sato | |
| 6,504,758 B2 * | 1/2003 | Sacco et al. | 365/185.18 |
| 6,552,447 B1 * | 4/2003 | Fuse | 307/68 |
| 6,628,013 B2 * | 9/2003 | Vogman | 307/85 |
| 6,798,709 B2 * | 9/2004 | Sim et al. | 365/226 |
| 6,901,014 B2 | 5/2005 | Son et al. | |
| 7,307,907 B2 | 12/2007 | Houston | |
| 7,345,931 B2 | 3/2008 | Partsch et al. | |
| 2003/0201673 A1 | 10/2003 | Sim et al. | |
| 2003/0223271 A1 | 12/2003 | Byeon et al. | |
| 2005/0128852 A1 | 6/2005 | Deng et al. | |
| 2007/0069802 A1 | 3/2007 | Choi et al. | |
| 2008/0054721 A1 * | 3/2008 | Frew et al. | 307/52 |

(Continued)

FOREIGN PATENT DOCUMENTS

DE    10 2006 035 122 A1    3/2007
KR       20030091499 A     12/2003

OTHER PUBLICATIONS

Office Action and English translation for Chinese Patent Application 200910139122.8, May 17, 2011.

(Continued)

*Primary Examiner* — Adolf Berhane
(74) *Attorney, Agent, or Firm* — Baker Botts L.L.P.

(57) ABSTRACT

A circuit and method for operating a circuit is provided that includes a circuit section that has a number of memory elements, a first voltage regulator that can be connected or is connected to the circuit section in order to operate the circuit section, a second voltage regulator that can be connected or is connected to the circuit section in order to preserve an information item stored in the memory elements, a switching device that is connected to the circuit section and is designed to deactivate and activate inputs of the circuit section. The circuit being configured to control a deactivation and activation of the first voltage regulator and the deactivation and activation of the inputs of the circuit section.

19 Claims, 4 Drawing Sheets

U.S. PATENT DOCUMENTS

| | | | |
|---|---|---|---|
| 2008/0161052 A1* | 7/2008 | Miyagawa et al. | 455/558 |
| 2008/0238378 A1* | 10/2008 | Uan-Zo-li et al. | 323/249 |
| 2009/0024856 A1* | 1/2009 | Lee | 713/320 |
| 2009/0033309 A9* | 2/2009 | Trafton et al. | 323/308 |
| 2009/0160251 A1* | 6/2009 | Mok et al. | 307/24 |

OTHER PUBLICATIONS

Office Action and English translation for Chinese Patent Application 200910139122.8, Nov. 4, 2011.

* cited by examiner

CIRCUIT AND METHOD FOR OPERATING A CIRCUIT

This nonprovisional application claims priority to German Patent Application No. 10 2008 027 392.9, which was filed in Germany on Jun. 9, 2008, and to U.S. Provisional Application No. 61/060,626, which was filed on Jun. 11, 2008, and which are both herein incorporated by reference.

BACKGROUND OF THE INVENTION

1. Field of the Invention

The present invention relates to a circuit and a method for operating a circuit.

2. Description of the Background Art

Digital circuits can be run in an operating mode for information processing and in a sleep mode (or standby) with reduced power consumption as compared to the operating mode. The information content in memory elements of the digital circuits can be preserved during this process if the memory elements are also supplied with a voltage in the sleep mode. For this purpose, one can provide a battery and/or rechargeable battery, for example, that is connected to the memory elements in sleep mode.

SUMMARY OF THE INVENTION

It is therefore an object of the present invention to improve a circuit to the greatest extent possible. Accordingly, a circuit is provided that can be monolithically integrated on a semiconductor chip.

The circuit has a circuit section having a number of memory elements that are, in particular, volatile, such as registers, latches, or flip-flops, for example.

The circuit can have a first voltage regulator that can be connected to the circuit section, in particular through a switch, or is permanently connected to the circuit section, in order to operate the circuit section.

The circuit can have a second voltage regulator that can be connected to the circuit section, in particular through a switch, or is permanently connected to the circuit section, in order to preserve information stored in the memory elements.

The circuit can have a switching device that is connected to the circuit section. The switching device is designed to deactivate and activate inputs of the circuit section. For the purpose of deactivation and activation, the switching device is advantageously connected ahead of the inputs of the circuit section. Preferably, the switching device has switching means, such as semiconductor switches and/or logic elements and/or switchable level shifters, for activation and deactivation of the inputs.

The circuit can be designed to control a deactivation and activation of the first voltage regulator and the deactivation and activation of the inputs of the circuit section. In advantageous fashion, the circuit section is designed and configured for control. Alternatively or in combination, the circuit has additional control means for control.

The invention can have the additional object of specifying a method that is improved to the greatest degree possible. Accordingly, a method for operating a circuit is also provided.

For a sleep mode, inputs of a circuit section of the circuit are deactivated, wherein the circuit section has a number of memory elements. The inputs can be designed and configured for information entering the circuit section, such as individual bits or bit words transmitted serially or in parallel. For deactivation, the input value is preferably switched to a fixed, predetermined logic voltage, for example zero or one.

A first voltage regulator is deactivated after deactivation of the inputs of the circuit section, so that the memory elements of the circuit section are supplied from a second voltage regulator. Preferably the first voltage regulator is deenergized for deactivation.

For an operating mode following the sleep mode, the first voltage regulator is activated in order to supply the circuit section. As compared to the sleep mode, the operating mode can have a higher power consumption, in particular in order to execute a plurality of functions, in particular procedure steps of a program sequence.

For the operating mode, the inputs of the circuit section are activated after activation of the first voltage regulator, in particular in order to process information entering through the inputs of the circuit section.

The invention additionally has the object of specifying a use. Accordingly, the use of a first voltage regulator for an operating mode and of a second voltage regulator for a sleep mode is provided. The first voltage regulator and the second voltage regulator are preferably components of one and the same monolithically integrated circuit. The information processing in the operating mode is significantly increased as compared to the sleep mode. In sleep mode, the power consumption is significantly reduced as compared to the operating mode. The memory content of memory elements of the circuit preferably is not changed in sleep mode.

In the operating mode, the first voltage regulator of a circuit provides a supply voltage and an operating current for a circuit section of the circuit.

The second voltage regulator of the circuit provides a standby voltage and a standby current for the circuit section for the sleep mode.

The second voltage regulator consumes less current than the first voltage regulator of the circuit. Preferably, the first voltage regulator is specifically designed for providing the operating current. Preferably, the second voltage regulator is specifically designed for providing the standby current. Preferably the standby current is smaller than the operating current by at least a factor of 100.

The improvements described refer to the circuit as well as to the use and to the method.

According to an embodiment, the circuit can be designed to control an operating mode with digital state changes of the circuit section and to control a sleep mode with no digital state changes, or with a reduced number of digital state changes as compared to the operating mode. In advantageous fashion, the current consumption in the sleep mode is reduced as compared to the operating mode.

According to another embodiment, the circuit can have an additional circuit section. The additional circuit section can be connected to inputs and/or outputs of the circuit section. In particular, the current consumption of the additional circuit section can be greater in the operating mode than that of the circuit section. Advantageously, the additional circuit section can have functions for transmitting and receiving signals transmitted by radio, in particular digital signal processing.

The circuit can have a switch that is connected to the additional circuit section and to the second voltage regulator. In addition, the switch can also be connected or capable of connection to the first voltage regulator. The circuit is preferably designed to operate the switch for the sleep mode for separating the additional circuit section from the second voltage regulator.

In another embodiment, the switching device can have a number of switchable level shifters. Preferably the circuit has components that are specified for at least two different voltages—for example, 3.3 V and 1.8 V. The level shifters are preferably designed and connected to convert information to and from one of the circuit sections between different logic levels at their inputs.

In another embodiment, the circuit has a reset device that can be designed to issue reset signals for resetting the circuit section and/or the additional circuit section. The reset device can be designed to control the switching device by means of control signals.

According to an embodiment, the reset device can be connected to the first voltage regulator. Preferably the reset device is designed to activate the first voltage regulator upon an initial application of an input voltage—in particular a battery voltage—to the circuit.

In another embodiment, the reset device can have a memory element whose stored value represents an initial application of an input voltage to the circuit.

The reset device can be designed to enable an activation of the first voltage regulator by the circuit section. Preferably the enabling takes place following the initial application of an input voltage.

According to an embodiment, provision is made that only the first voltage regulator of the two voltage regulators has a control loop, which is connected to a supply voltage output of the first voltage regulator, in particular through a voltage divider. Preferably the first voltage divider is connected to a reference voltage source. It is preferred for the reference voltage source to be a band gap reference voltage source. Preferably the second voltage regulator has its own current reference. The second voltage regulator thus generates its own bias current (self biasing). The current reference of the second voltage regulator has a lower precision and constancy than the band gap reference voltage source of the first voltage regulator. Preferably the second voltage regulator has a current-to-voltage converter for generating the supply voltage from the bias current. Preferably the second voltage regulator is connected in parallel with the first voltage regulator, so that the outputs of the first and second voltage regulators are connected to one another. Preferably in this situation, the second voltage regulator has means that act as a diode. The second voltage regulator advantageously has a transistor that is connected as an emitter follower or source follower. The transistor acts as a diode here, so that no significant current flows into the second voltage regulator in the reverse direction of the diode.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
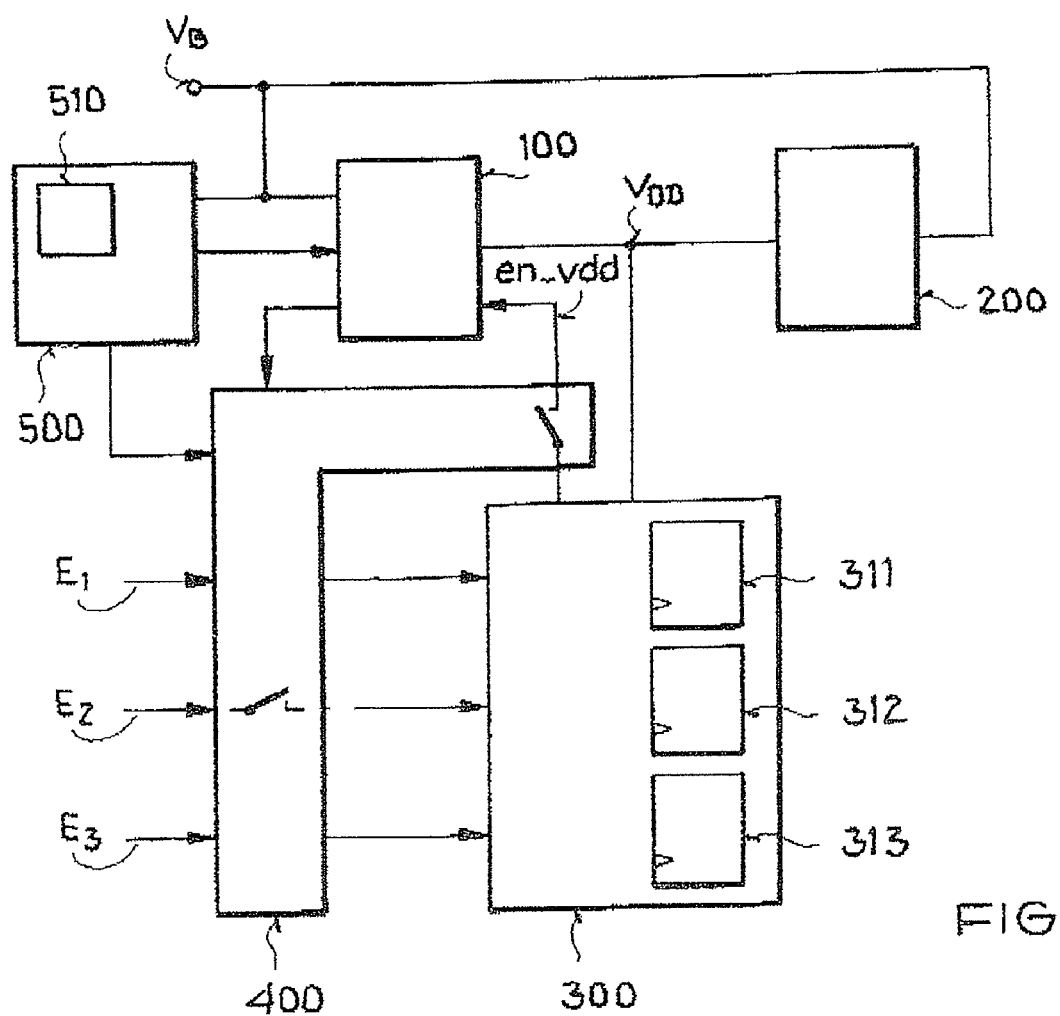
FIG. 1 is a first schematic block diagram of a circuit.

In FIG. 1, a circuit is schematically represented by a block diagram. A digital circuit section 300 has a number of memory cells 311, 312, 313 such as, e.g., flip-flops or registers. The memory cells 311, 312, 313 are volatile, so that the information stored in the memory cells 311, 312, 313 is lost when no supply voltage VDD is applied. The circuit in the example embodiment in FIG. 1 is supplied by a battery voltage VB. This battery voltage VB can vary, for example in a voltage range up to 3.6 V. The digital circuit section 300, in contrast, has components that are specified for a lower supply voltage VDD of a nominal 1.8 V to a maximum 2.0 V.

A first voltage regulator 100 is connected to the battery voltage VB. The first voltage regulator 100 is designed to provide at its output the supply voltage VDD for the digital circuit section 300. In this context, the first voltage regulator 100 is designed to output a supply voltage for an operating mode for the digital circuit section 300. In the operating mode, the digital circuit section 300 executes steps of an information processing task, thus for example a calculation, storage, or the like. For this purpose, logic values of basic digital cells, such as gates, flip-flops, or the like, change, wherein this state change causes a charging and discharging of capacitors. A total displacement current through all capacitors is made available in this situation by the first voltage regulator 100 via the supply current. The first voltage regulator 100 additionally requires its own operating current of approximately 100 µA in order to regulate the supply voltage VDD to a stable value.

In addition, the circuit shown in FIG. 1 can also be run in a sleep mode. To this end, the circuit has means that initiate a sleep mode. For example, the sleep mode can be initiated by the circuit section 100 itself or by a connected circuit (not shown in FIG. 1). In sleep mode, the current consumption of the circuit should be minimized. For example, the current consumption is approximately 0.1 µA in order to ensure a long battery life.

Because of the high internal current consumption of the first voltage regulator 100, said voltage regulator is deactivated in the sleep mode. For deactivation of the first voltage regulator 100, it can be switched off by means of a switch (not shown), for example.

In sleep mode, the information stored in the memory cells 311, 312, 313 is supposed to be preserved. In contrast to the example embodiment in FIG. 1, it is possible in principle to design the circuit section 300 with components for the battery voltage VB in such a manner that the circuit section would only have to be connected to the battery voltage VB in sleep mode to preserve the stored information. However, a different solution is provided in FIG. 1.

In the example embodiment from FIG. 1, connected in parallel to the first voltage regulator 100 is a second voltage regulator 200, which likewise provides the supply voltage VDD and is connected to the first circuit section 100 in the same manner as the first voltage regulator 100. As an alternative to FIG. 1, it is also possible to connect a number of switches between a voltage regulator 100 or 200 and the circuit section 300 in such a manner that the circuit section can be connected to the first voltage regulator 100 and/or to the second voltage regulator 200 by means of a switch.

The internal current consumption of the second voltage regulator 200 is smaller than the internal current consumption of the first voltage regulator 100. The first voltage regulator 100 provides a maximum supply voltage that is greater than the maximum supply voltage of the second voltage regulator 200. In the example embodiment in FIG. 1, the first voltage regulator 100 and the second voltage regulator 200 are connected in parallel.

In the example embodiment from FIG. 1, the first voltage regulator 100 can be activated in a controlled manner through the circuit section 300 as well as through a reset device 500. During the initial startup after the application of an input voltage VB (battery voltage), the first voltage regulator 100 is activated by the reset device 500. A piece of information corresponding to the initial startup is stored in a memory element 510, for example a flip-flop, of the reset device 500. Subsequently, the control function of activation and deactivation is transferred to the circuit section 300 by the reset device 500. To this end, the reset device 500 enables the connection between the circuit section 300 and the first voltage regulator 100 by means of a switching device 400. The circuit section 300 can now in turn control the activation and deactivation of the first voltage regulator 100 by means of the control signal en_vdd. In advantageous fashion, the reset device 500 is also designed to reset the circuit section 300, for example upon initial startup.

The switching device 400 is designed to activate and deactivate inputs E1, E2, E3 of the circuit section 300. In the example embodiment in FIG. 1, this switching function of activation and deactivation of the inputs E1, E2, E3 is controlled by the first voltage regulator 100, which outputs a control signal vdd_ok33 to the switching device 400 for activation and deactivation of the inputs E1, E2, E3.

Figure 2:
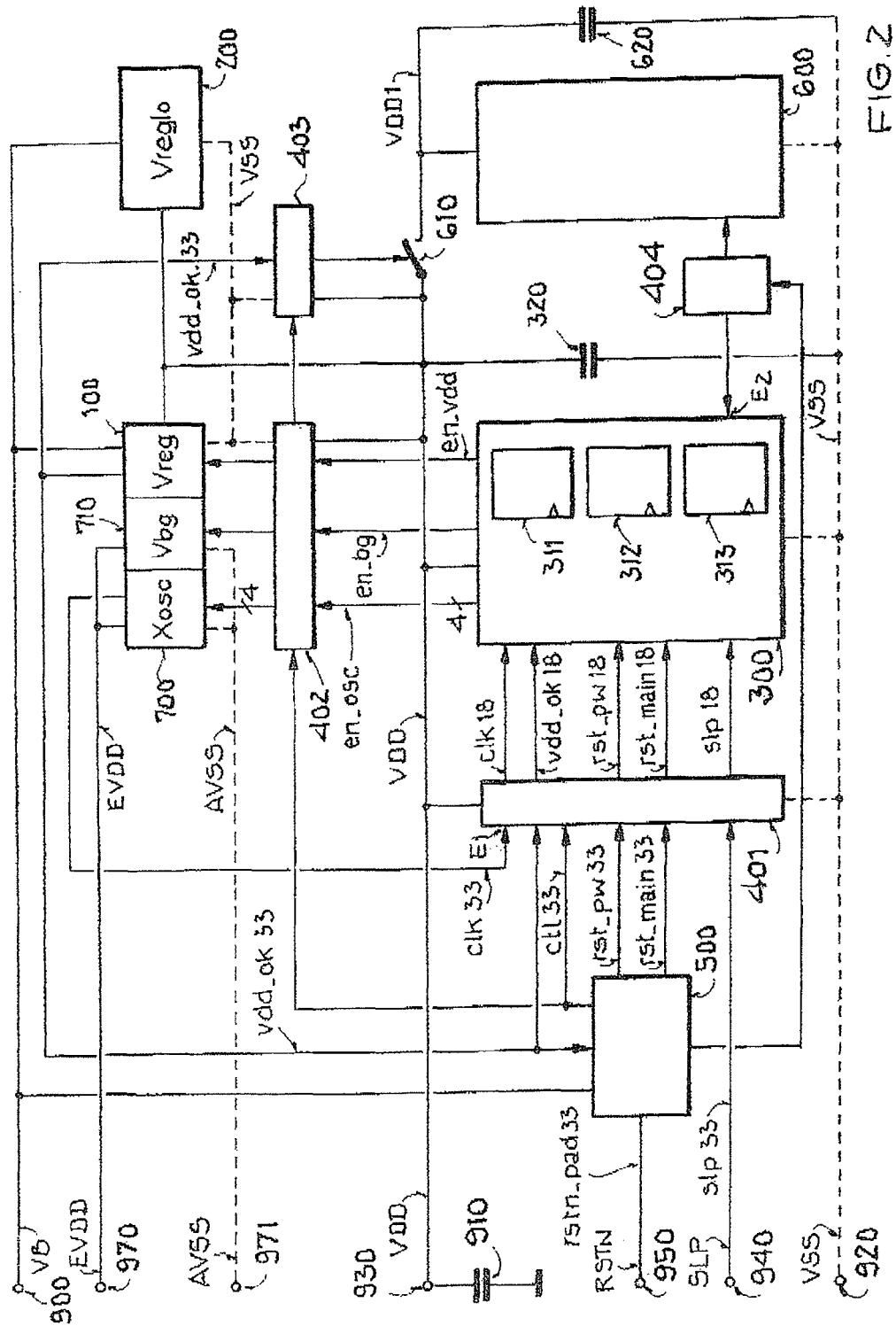
FIG. 2 is a second schematic block diagram of a circuit.

In FIG. 2, another example embodiment is shown schematically as a block diagram of a circuit. A circuit section 300 with control functions and test functions is supplied through the supply voltages VDD and VSS, each of which is connected to the circuit through a terminal 930 or 920, respectively. A capacitor 320 is connected in parallel to the circuit section 300. An external capacitor 910 can additionally be connected in parallel by means of the terminals 920 and 930.

The supply voltage VDD (approximately 1.8 V) is produced from an input voltage VB (approximately 3.3 V) present at the terminal 900 by means of an activatable and deactivatable voltage regulator 100 (Vreg). In addition, an oscillator circuit 700 (Xosc) and a band gap reference voltage source 710 are provided, which are supplied with the voltages EVDD and AVSS at the terminals 970 and 971.

The blocks 410, 402, 403 and 404 of a switching device have multiple functions. The blocks 401, 402 and 403 have level shifters in order to transfer signals between a voltage of the input voltage VB and a voltage of the supply voltage VDD in the applicable direction. The level shifters of block 401 and block 403 convert incoming signals of the voltage of the input voltage VB to corresponding signals with the voltage of the supply voltage VDD. The level shifters of block 402 convert incoming signals of the voltage of the supply voltage VDD to corresponding signals with the voltage of the input voltage VB.

In addition, a reset device 500 is provided that is connected to the terminal 950 to receive a reset signal RSTN. The reset signal RSTN serves to reset the circuit by the external reset signal RSTN, regardless of the present mode. The reset device 500 has another input that is connected to a signal output of the first voltage regulator 100. At the signal output, the first voltage regulator provides a status signal vdd_ok33, which indicates a regulated supply voltage VDD.

As a function of the input signals explained above, the reset device 500 carries out corresponding reset functions. This is explained in more detail in connection with FIG. 3. In the example embodiment from FIG. 2 as well, the first voltage regulator 100 is activated by the reset device 500 during initial startup after the application of the input voltage VB (battery voltage). Subsequently, the control function of activation and deactivation is again transferred to the circuit section 300 by the reset device 500. To this end, the reset device 500 outputs a control signal to the block 402 of the switching device, so that the connection between the circuit section 300 and the first voltage regulator 100 is enabled. The circuit section 300 independently controls the activation and deactivation of the first voltage regulator 100 by means of the control signal en_vdd.

The circuit section 300 is designed to control the activation and deactivation of the first voltage regulator 100. The initiation of a sleep mode is possible through a signal SLP at the terminal 940, in that the current consumption of the circuit is reduced as compared to an operating mode. For this purpose, the signal SLP arrives at the input E4 through the level shifter of block 401 to the circuit section 300. The circuit section 300 deactivates the first voltage regulator 100 through the block 402 by means of the signal en_vdd. In addition, the circuit section 300 deactivates the band gap reference voltage source 710 by means of the signal en_bg through the block 402, and deactivates the oscillator circuit 700 by means of the signal en_osc. Alternatively, it is also possible for the circuit section 300 to automatically initiate a sleep mode, for example after executing a program sequence.

The status signal vdd_ok33 of the deactivated first voltage regulator 100 arrives at the blocks 401 and 403 and at the reset device 500. In this process, the switch 610 is operated through the level shifter of the block 403 such that an additional circuit section 600 is isolated from the supply voltage VDD. Once again, a capacitor 620 is connected in parallel to the additional circuit section 600. The additional circuit section 600 is designed to transmit and receive digital data. In the operating mode, the additional circuit section 600 is supplied with the supply voltage VDD by the first voltage regulator 100. In sleep mode, in contrast, the additional circuit section is isolated from the supply voltage VDD by the switch 610.

In sleep mode, only the second voltage regulator 200 (Vreglo) is active, which has a smaller current consumption than the first voltage regulator 100, in particular smaller by at least a factor of 100. The supply outputs of the first voltage regulator 100 and of the second voltage regulator 200 are connected to one another and to the circuit section 300. Since the circuit section 300 is also supplied with the supply voltage VDD in the sleep mode—by the second voltage regulator 200—the information contained in the memory elements 311, 312, 313 is also preserved in the sleep mode. The states (low, high) of the digital elements (gates, etc.) of the circuit section 300 remain defined.

The states of the digital elements (gates, etc.) of the additional circuit section 600, in contrast, are not defined because of the isolation by the switch 610. So that these undefined states of the additional circuit section 600 do not affect the circuit section 300, a block 404 of the switching device, designed to deactivate and activate the inputs E2 of the circuit section 300, is provided in the example embodiment in FIG. 2. If the inputs E2 of the circuit section 300 are deactivated by the switching function of the block 404 in sleep mode, then no undefined states of the additional circuit section 600 can arrive at the circuit section 300. In like manner, the input E1 for the clock signal clk33 is deactivated by the switching function of the block 401 of the switching device in sleep mode so that no clock signal clk18 arrives at the circuit section 300.

Figure 3:
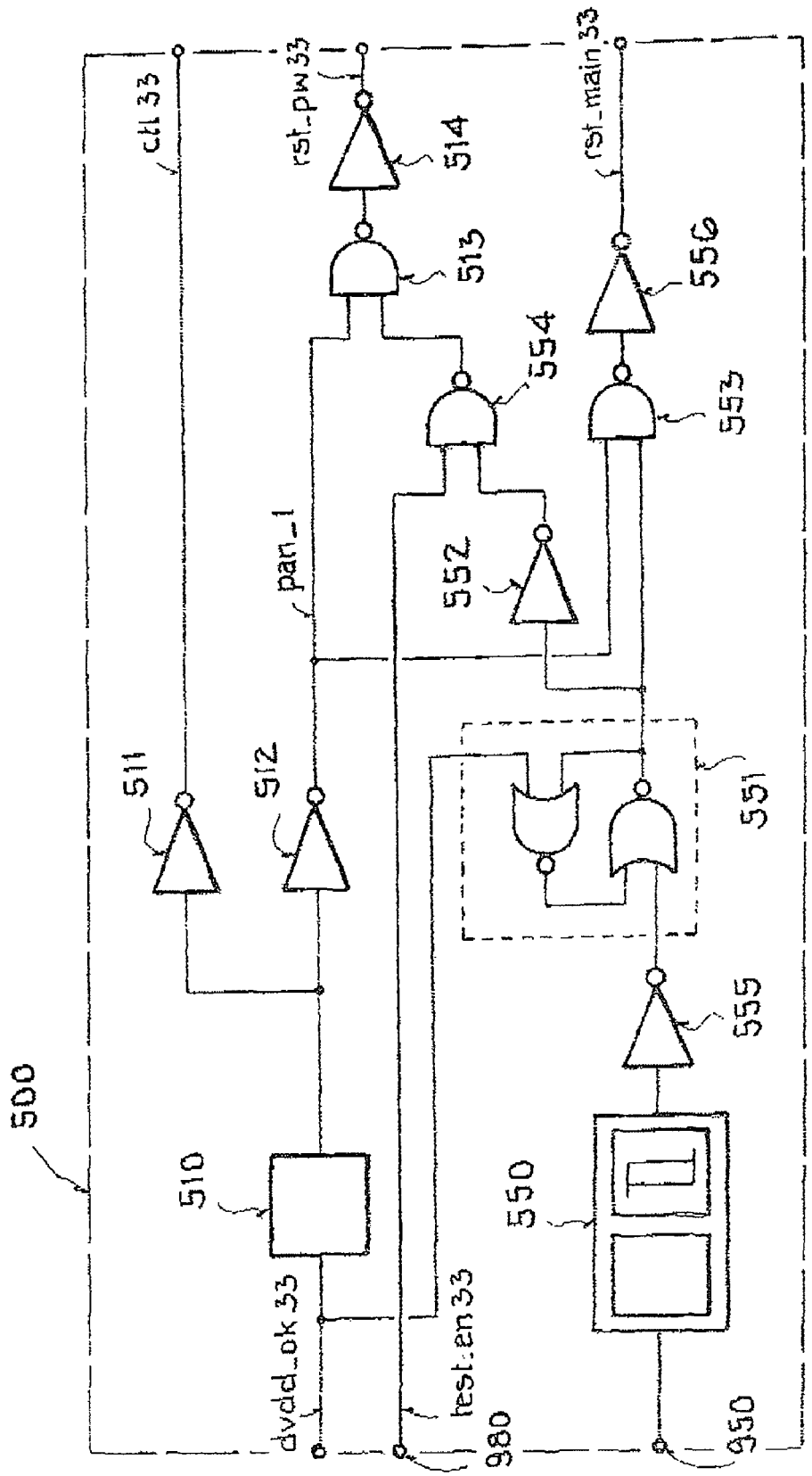
FIG. 3 is a schematic block diagram of a reset circuit.

In FIG. 3, a reset device 500 is shown schematically. This device has a plurality of inverters 511, 512, 514, 552, 555, 556, a plurality of NAND gates 513, 553, 554, flip-flops 510, 551, and a filter 550. An additional terminal 980 is provided for test purposes. The reset device 500 has two functions. The reset device 500 generates a reset signal upon application of the input voltage VB and filters at the terminal 950 a reset signal rstn generated outside of the circuit.

The RS flip-flop 510 has a static and dynamic asymmetry of its transistors. This implementation has the effect that the RS flip-flop 510 enters a defined "on" state upon application of the input voltage VB. The output signal of the RS flip-flop 510 forces both reset output signals to low potential, which accomplishes a reset of all circuit sections 300, 600. The RS flip-flop 510 maintains this state until the supply voltage VDD is ramped up. The status signal vdd_ok33 from the first voltage regulator 100 resets the RS flip-flop 510 and terminates the reset signals rst_pw33, rst_main33.

The external signal rstn travels through the filter 550, which delays the falling edge of the signal in order to avoid spikes in the reset signal. The rising edge, in contrast, is not delayed. The additional flip-flop 551 stores the reset event in sleep mode. This is necessary because at first there is not yet a supply voltage VDD available to the circuit section 300 when the input voltage VB is being applied. For this reason, after the ramp-up of the supply voltage VDD, and the status signal vdd_ok33 of the first voltage regulator 100 resets the flip-flop 551.

Figure 4:
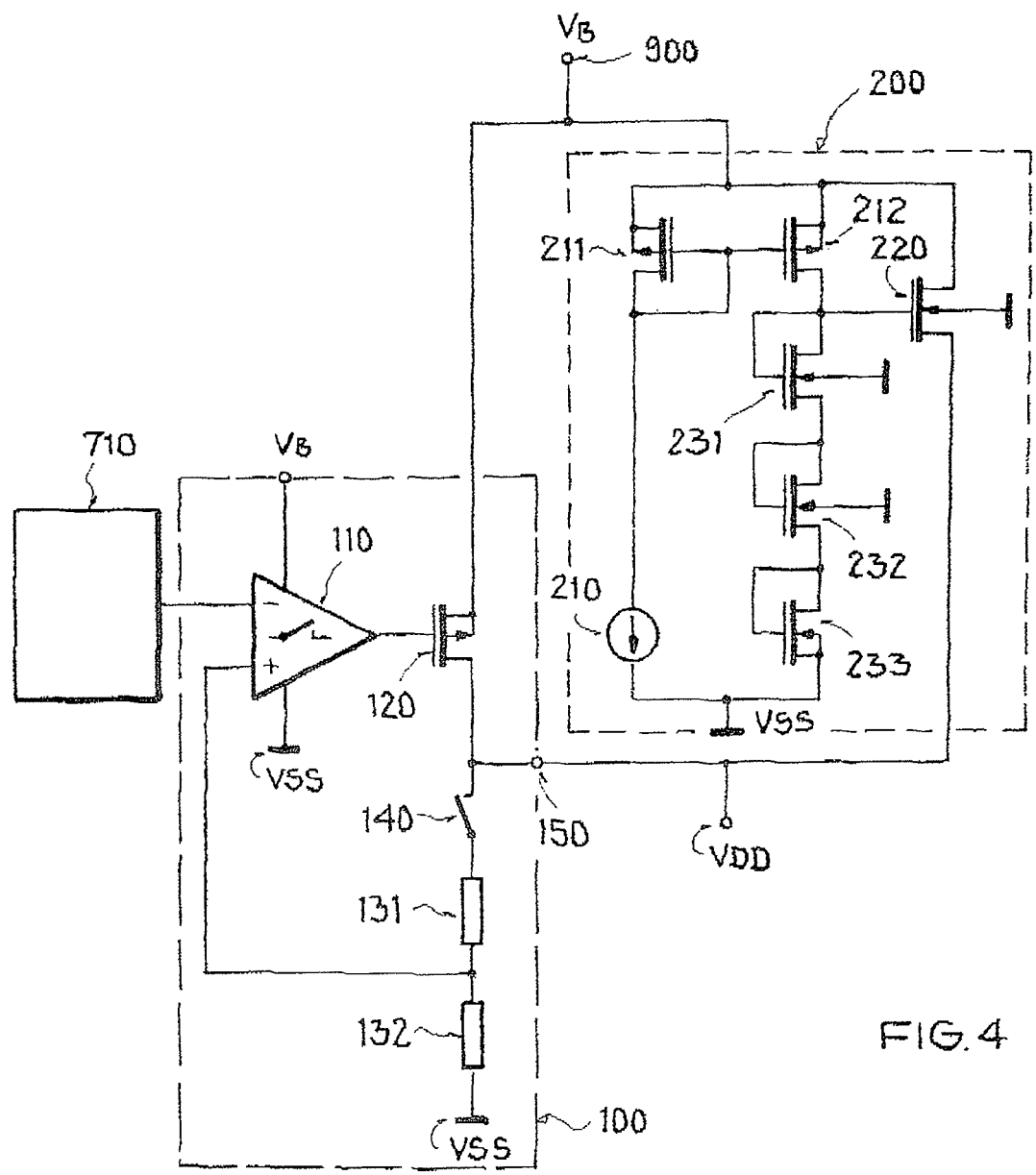
FIG. 4 is a schematic block diagram of two voltage regulators.

In FIG. 4, the first voltage regulator 100 and the second voltage regulator 200 are shown schematically in a circuit diagram.

The first voltage regulator has an operational amplifier 110 with differential amplifier and driver stage; whose negative input is connected to the band gap reference voltage source 710. The gap reference voltage source 710 provides a reference voltage of 1.25 V here. The output of the operational amplifier 100 is connected to a P-MOSFET output transistor 120, which is configured for the supply current in operating mode to a maximum of 30 mA. The output 150 of the first voltage regulator 100 is connected to the drain terminal of the transistor 120. Also connected to the drain terminal of the transistor 120 is a resistor voltage divider with the resistors 131 and 132, wherein the center tap of the resistor voltage divider is connected to the positive input of the operational amplifier 110.

This connection from the output through the resistor voltage divider to the input of the operational amplifier 110 constitutes a control loop. This control loop makes it possible to stabilize load changes at the output 150 in operating mode. The supply voltage can be held constant at the value of 1.8 V by means of the control loop.

The operational amplifier 110 can be switched off in sleep mode in order to deactivate the first voltage regulator 100. In addition, in sleep mode the resistor voltage divider is isolated from the output 150 by the switch 140. The operational amplifier 110 required for the control loop is largely responsible for the current consumption of 100 μA in operating mode. The second voltage regulator 200 is always switched on. The second voltage regulator 200 has a current source 210 for a current IBIAS, which is mirrored by means of the two PMOS transistors 211, 212 wired as a current mirror to the series-connected NMOS transistors 231, 232, 233 wired as MOS diodes. The current source may be a PTAT circuit, for example.

The voltage dropping across the NMOS transistors 231, 232, 233 is also present at the NMOS transistor 220 wired as a source follower, whose source is connected to the output of the second voltage regulator 220 and performs voltage regulation. In this arrangement, the second voltage regulator 200 provides the supply voltage VDD in sleep mode, for example at a level of 1.6 V. The supply voltage in sleep mode can lie in a range between 1.2 V and 2.0 V without the information stored in the memory elements 311, 312, 313 of the circuit section 300 being lost. Thus, the supply voltage VDD can deviate in the operating mode and from that in the sleep mode.

In this arrangement, the second voltage regulator 200 has no control loop connected with the output of the second voltage regulator 200.

The invention is not restricted to the variant embodiments shown in FIGS. 1 through 4. For example, it is possible to use different voltage regulator circuits than those explained in FIG. 4. The functionality of the circuit from FIG. 2 can be used to particular advantage for a radio network system, especially in compliance with the IEEE 802.15.4 industry standard for battery operation.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A circuit comprising:
   a first voltage regulator;
   a second voltage regulator; and
   a circuit section, the circuit section comprising a memory element and operable to:
      receive a supply voltage from the first voltage regulator when in an operating mode;
      transition from the operating mode to a sleep mode, the transition comprising deactivation of inputs of the circuit section; and
      receive a standby voltage from the second voltage regulator when in the sleep mode, the standby voltage being less than the supply voltage and sufficient to preserve an information item stored in the memory element.

2. The circuit of claim 1, further comprising a switching device operable to:
   receive a control signal from the first voltage regulator; and
   deactivate the inputs of the circuit section in response to the control signal.

3. The circuit of claim 1, further comprising a switching device operable to:
   receive a control signal from the circuit section; and
   deactivate the first voltage regulator in response to the control signal.

4. The circuit of claim 1, wherein the circuit section is operable to transition from the sleep mode to the operating mode.

5. The circuit of claim 1, further comprising:
   an additional circuit section; and
   a switch connectable to the additional circuit section and to the second voltage regulator, the switch in a state for the sleep mode configured to separate the additional circuit section from the second voltage regulator.

6. The circuit of claim 5, wherein the first voltage regulator comprises a control loop connectable through a voltage divider to a supply voltage output of the first voltage regulator.

7. The circuit of claim 1, further comprising a reset device configured to issue reset signals for resetting the circuit section.

8. The circuit of claim 7, wherein the reset device is connectable to the first voltage regulator and is configured to activate the first voltage regulator upon an initial application of an input voltage to the circuit.

9. The circuit of claim 7, wherein the reset device is configured to enable an activation of the first voltage regulator by the circuit section.

10. A method comprising:
    delivering to a circuit section of a circuit a supply voltage from a first voltage regulator when in an operating mode;

transitioning from the operating mode to a sleep mode, the transition comprising deactivation of inputs of the circuit section; and delivering to the circuit section a standby voltage from a second voltage regulator when in the sleep mode, the standby voltage being less than the supply voltage and sufficient to preserve an information item stored in a memory element.

11. The method of claim 10, comprising:

receiving a control signal from the first voltage regulator; and deactivating the inputs of the circuit section in response to the control signal.

12. The method of claim 10, comprising:

receiving a control signal from the circuit section; and deactivating the first voltage regulator in response to the control signal.

13. The method of claim 10, further comprising transitioning from the sleep mode to the operating mode.

14. The method of claim 10, wherein the circuit comprises:

an additional circuit section; and a switch connectable to the additional circuit section and to the second voltage regulator, the switch in a state for the sleep mode configured to separate the additional circuit section from the second voltage regulator.

15. The method of claim 14, wherein the first voltage regulator of the first and second voltage regulators has a control loop, the control loop connectable to a supply voltage output of the first voltage regulator through a voltage divider.

16. The method of claim 10 comprising issuing a reset signal for resetting the circuit section.

17. The method of claim 16 comprising activating the first voltage regulator upon an initial application of an input voltage to the circuit.

18. The method of claim 16 comprising enabling an activation of the first voltage regulator by the circuit section.

19. A circuit comprising:

means for delivering to a circuit section a supply voltage from a first voltage regulator when in an operating mode;

means for transitioning from the operating mode to a sleep mode, the transition comprising deactivation of inputs of the circuit section; and means for delivering to the circuit section a standby voltage from a second voltage regulator when in the sleep mode, the standby voltage being less than the supply voltage and sufficient to preserve an information item stored in a memory element.

\* \* \* \* \*

UNITED STATES PATENT AND TRADEMARK OFFICE
CERTIFICATE OF CORRECTION

PATENT NO.        : 8,193,792 B2
APPLICATION NO.   : 12/481330
DATED             : June 5, 2012
INVENTOR(S)       : Wolfram Kluge et al.

Page 1 of 1

It is certified that error appears in the above-identified patent and that said Letters Patent is hereby corrected as shown below:

On the Title page of the patent: (73) Assignee:

After "Assignee" and before "Corporation" delete "Amtel" and insert --Atmel--.

Signed and Sealed this
Fourteenth Day of October, 2014

Michelle K. Lee
*Deputy Director of the United States Patent and Trademark Office*